United States Patent [19]
Gaddis et al.

[11] Patent Number: 5,901,061
[45] Date of Patent: May 4, 1999

[54] METHOD OF CHECKING FOR RACES IN A DIGITAL DESIGN

[75] Inventors: Neela Bhakta Gaddis; Samuel D. Naffziger; Jonathan Lotz, all of Fort Collins, Colo.

[73] Assignee: Hewlett-Packard Company, Palo Alto, Calif.

[21] Appl. No.: 08/653,581

[22] Filed: May 24, 1996

[51] Int. Cl.$^6$ .................................................. G06F 17/50
[52] U.S. Cl. ........................................... 364/488; 364/578
[58] Field of Search ................................... 364/578, 488, 364/489, 490

[56] References Cited

U.S. PATENT DOCUMENTS

| | | | |
|---|---|---|---|
| 3,633,100 | 1/1972 | Hellwell et al. | 364/578 |
| 5,124,572 | 6/1992 | Mason et al. | 327/259 |
| 5,306,962 | 4/1994 | Lamb | 327/145 |
| 5,463,561 | 10/1995 | Razdan | 364/489 |
| 5,507,029 | 4/1996 | Granato et al. | 364/490 |

*Primary Examiner*—Vincent N. Trans

[57] ABSTRACT

A method of using a fet level simulator to check for races in a digital design. The method comprises varying digital design models input into the simulator. Each model comprises a clock gater circuit producing clocks with differing overlaps and dead times. Raw data files corresponding to each model input are generated by the fet level simulator. The raw data files preferably comprise lists of node values with corresponding time stamps. Corresponding latch node values in the raw data files are compared to identify the nodes of a circuit which are affected by races. Identifying affected latch nodes allows a race's root cause to be quickly pinpointed. Vector inputs to the fet level simulator may be varied. If vector inputs are varied, comparison of the raw data files comprises comparing the files generated for differing models with common vector inputs. Apparatus for implementing the above method is also disclosed. The method and apparatus provide for increased race coverage, and decrease the time and effort required to debug races once their presence is identified.

19 Claims, 7 Drawing Sheets

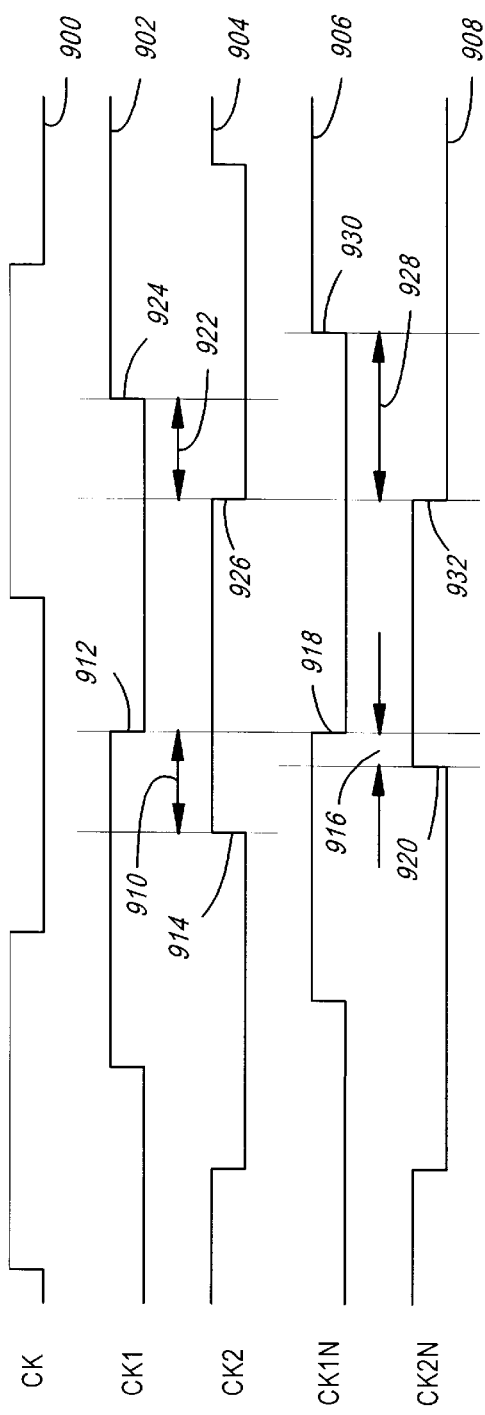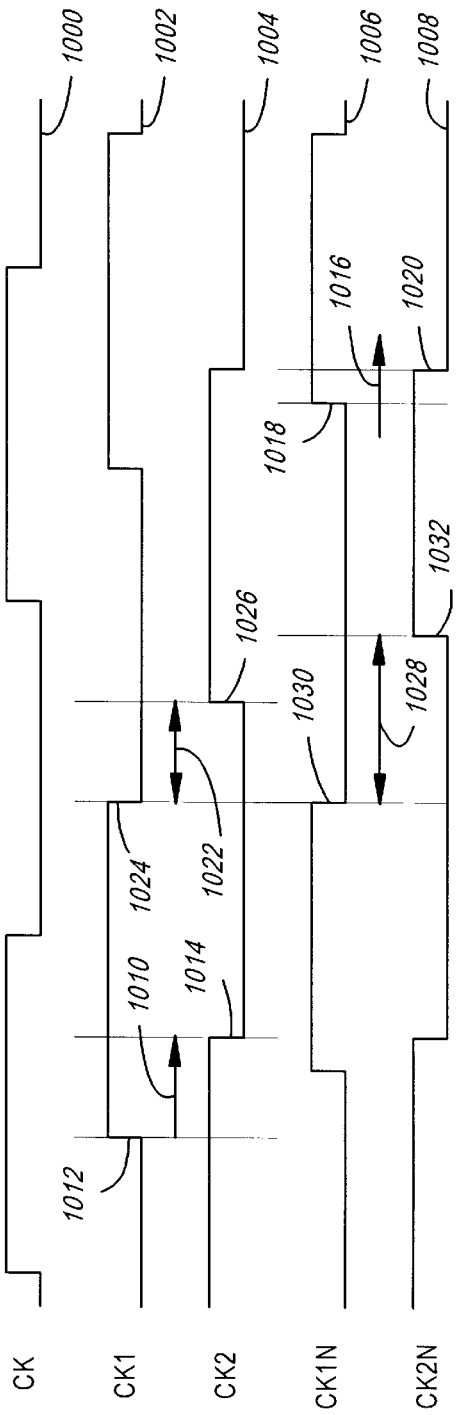

METHOD OF CHECKING FOR RACES IN A DIGITAL DESIGN

BACKGROUND OF THE INVENTION

The invention pertains to a method of checking for races in a digital design. More particularly, the invention pertains to an efficient and accurate method of locating races within a very large scale integrated (VLSI) circuit comprising only one system clock.

The performance of VLSI circuits has been significantly improved in recent years. Many of their improvements are derived from new hardware devices which are capable of operating at higher clock frequencies. However, as the clock frequencies of such circuits are increased, increased efforts must be made to prevent performance degradation as a result of clock skew, edge degradation, and the like.

Clock skew is demonstrated in FIG. 2. Overlapping clock signals CK1 204 and CK2 206 may be ideally timed as illustrated by the dashed lines in FIG. 2. However, their timings, upon reaching a particular unit of a hypothetical VLSI circuit, may be as shown by the solid lines 200, 202 of FIG. 2. By design, the clock signals 204, 206 have an overlap designated by the left-most arrow 208. However, routing paths, manufacturing variances, and other factors can result in one or both of the clock signals being delayed before reaching a particular unit of the hypothetical VLSI circuit. These delays are known as clock skew. In FIG. 2, signal CK1 200 is "skewed", resulting in an additional overlap 210 between signals CK1 and CK2.

Another problem caused by manufacturing variances, line coupling, and other factors is edge degradation. Edge degradation is demonstrated in FIG. 3. If edge degradation is significant, clock signal edges may rise and fall slowly (demonstrated by the waveforms of clocks CK1N 300 and CK2N 302 in FIG. 3). In a high frequency circuit, these slow transitions from "clock HI" to "clock LO", or vice versa, can cause errors in a circuit pipeline (e.g., 1100, FIG. 11). Note that ideally, clock signals CK1N 304 and CK2N 306 are non-overlapping, but due to edge degradation, an overlap 308 between the signals can result.

Errors caused by clock skew and/or edge degradation are herein referred to as clock signal races and are characterized by data from one stage 1104 of a pipeline being passed to a subsequent stage 1114 before the proper clocking signal has been received to clear the subsequent stage 1114 of data previously stored in that stage.

Thus, a race may lead to a data collision and result in lost and/or corrupted data. As known to those skilled in the art, approximately 99% of all races are attributable to clock skew, and the slower rise/fall times of clock signal edges due to edge degradation.

Fortunately, clock races may be fixed using various "gated" clock signals. Examples of gated signals are disclosed in U.S. Pat. No. 5,124,572 to Mason et al., and U.S. Pat. No. 5,306,962 to Lamb, which are hereby incorporated by reference for all that they disclose. Gated clock signals are also disclosed in the U.S. Pat. Application of Perez filed Mar. 1, 1996 (Ser. No. 08/609,592) entitled "High-Performance, Low-Skew Clocking Scheme for Single-Phase, High-Frequency Global VLSI Processor Clocks", and the U.S. Patent Application of Naffziger filed Mar. 1, 1996 (Ser. No. 08/609,306) entitled "Local CMOS Clock Buffer Circuits". These applications are also incorporated by reference for all that they disclose. Mason et al. and Lamb disclose a clocking methodology for VLSI circuits which selectively uses the edges of two overlapping clocks and two non-overlapping clocks to eliminate race conditions. The overlapping clocks are used wherever possible to provide superior timing advantages, while the non-overlapping clocks are used to eliminate race conditions as data propagates down a pipeline of transparent registers.

However, before one may fix a race, one must first identify where race specifications have been violated. Existing methods which are used to induce and/or identify races include: inspection, varying clock inputs, and asserting top level signals.

Inspection relies on one or more engineers making a visual inspection of a circuit's schematic. Circuits are checked, and then cross-checked. This method is not only time consuming, but also error prone and non-exhaustive.

One method of inducing races involves creating a model of the circuit, and then varying the timing of the model's clock inputs. A disadvantage of this method is that it relies on the existence of more than one system clock.

Races are often identified by asserting top level signals. This method relies on induced race failures propagating to the "top" of a circuit (i.e., its input/output (I/O) ports, or contact pads). Unfortunately, many races do not propagate to the top. Of the races that do propagate to the top, a large percentage of the races may have a root cause which lies significantly distant from a top level signal. Failures must be traced to their root cause, and some races can be extremely difficult to debug. Furthermore, there is a problem of masking. When relying on a race to propagate to the top, one race can often mask the affects of another race. Such an occurrence can lead to numerous repetitions of the method, and complex, repetitive tracings through circuit paths.

Some of the newer VLSI circuits have only one system clock, and existing methods of race checking are ill-equipped to deal with these circuits. Race checking by inspection is obviously difficult due to the inherent complexity of VLSI circuits. Likewise, signal assertion is a less than adequate method since once a failure is identified, a race must be traced to its root cause through multiple stages of logic. This can be an extremely time consuming, costly, and unbearable task.

Varying clock signals to induce races is not even an option with a circuit having only one system clock. In such a circuit, overlapping and non-overlapping clocks are locally generated by each unit of a VLSI circuit. Variation of the single system clock input, from which all other clock signals are derived, fails to create the varying degrees of clock overlap which help to induce races.

Regardless of the method(s) used to check for races, it is very important to locate all races prior to building a silicon prototype. If races are not identified "pre-silicon", locating and debugging races becomes significantly more time consuming and costly.

It is therefore a primary object of this invention to provide an exhaustive method of checking for clock-based races.

It is another primary object of this invention to provide a method which more precisely pinpoints the location of races, thereby decreasing the time and effort required to debug them.

It is also an object of this invention to provide a method which increases the observability of races.

It is yet another object of this invention to provide a method which decreases the occurrence of race checking oversights and/or errors.

It is a further object of this invention to provide a method which may be used to identify races prior to the creation of circuit masks and/or a silicon prototype.

An additional object of this invention is to provide a method which can be used to locate races in a VLSI circuit having only one system clock.

A final object of this invention is to provide a method which can be used to detect races which do not propagate to the "top".

SUMMARY OF THE INVENTION

In the achievement of the foregoing objects, the inventors have devised a method of using a fet level simulator to check for races in a digital design. The method comprises the steps of varying digital design model inputs (circuit model inputs) to the fet level simulator, and then comparing lists of values (raw data files) generated by the simulator. Each model comprises a clock gater circuit which is capable of producing a number of clocks with differing degrees of overlap and dead time. The models preferably comprise a model with a normal clock gater circuit, and at least one model with a race inducing clock gater circuit. The generated lists preferably comprise lists of values for all of the nodes in a circuit, along with corresponding time stamps. During a comparison of the lists, only latch node values need be compared. However, it is preferable to generate data for all nodes for ease of debugging.

In addition to varying the models input into the simulator, vector inputs (top level signals) may also be varied. When this is done, a raw data file is generated for each combination of model and vector inputs. Values in raw data files generated for differing models with common vector inputs are compared.

Comparison of latch node values generated using the different models allows a race's root cause to be quickly pinpointed, thus decreasing the time and effort required to debug a race. Comparison of latch node values (which are scattered throughout a circuit) also allows for increased coverage over race checking methods wherein race errors must propagate to the top of a circuit for identification.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawing in which:

FIG. 9 is a timing diagram illustrating the timing relationships between clock signals of a first "modeled" race inducing clock gater circuit, wherein clock signals CK1 and CK1N are delayed with respect to their FIG. 8 equivalents;

FIG. 10 is a timing diagram illustrating the timing relationships between clock signals of a second "modeled" race inducing clock gater circuit, wherein clock signals CK2 and CK2N are delayed with respect to their FIG. 8 equivalents.

DESCRIPTION OF THE PREFERRED EMBODIMENT

Figure 1:
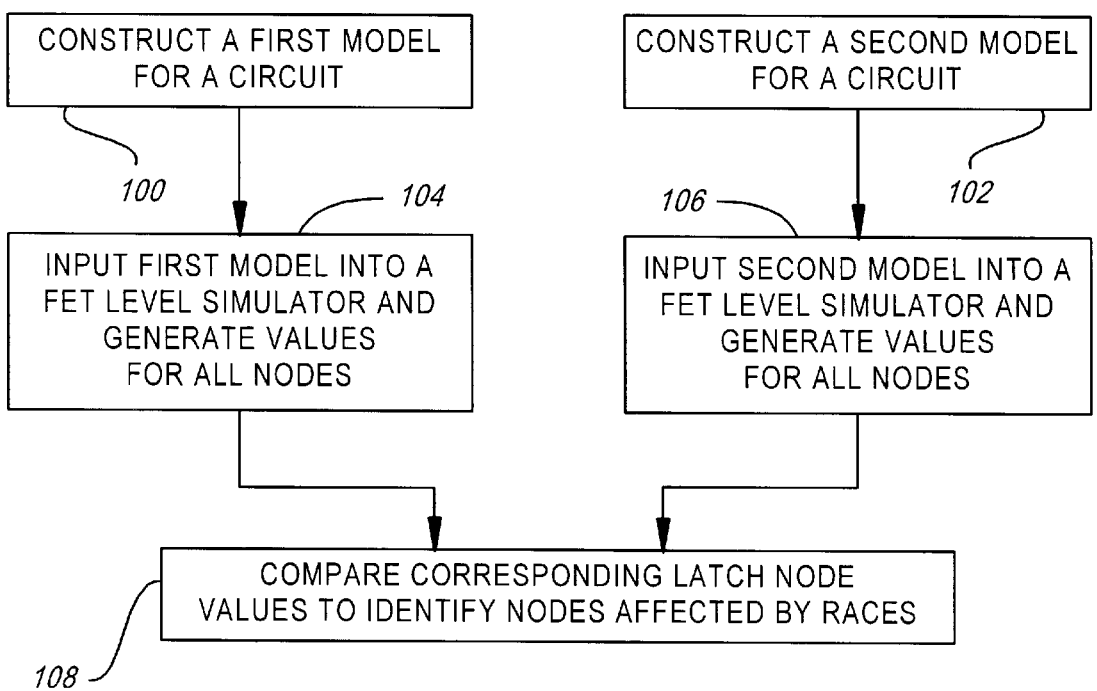
FIG. 1 is a flow chart of the steps in a preferred method of checking for races in a digital design.
Figure 2:
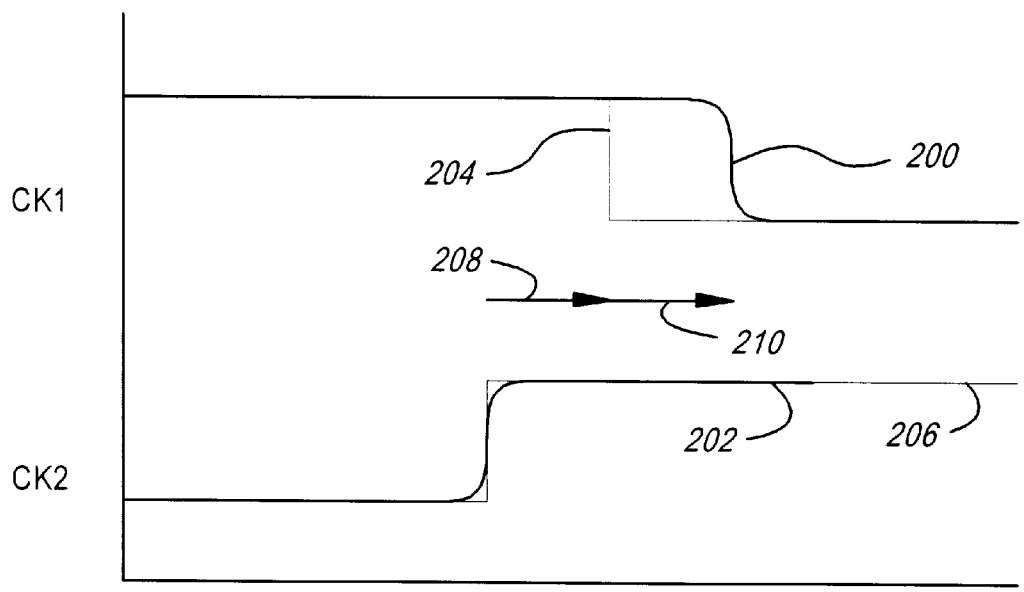
FIG. 2 is a timing diagram illustrating clock skew.
Figure 3:
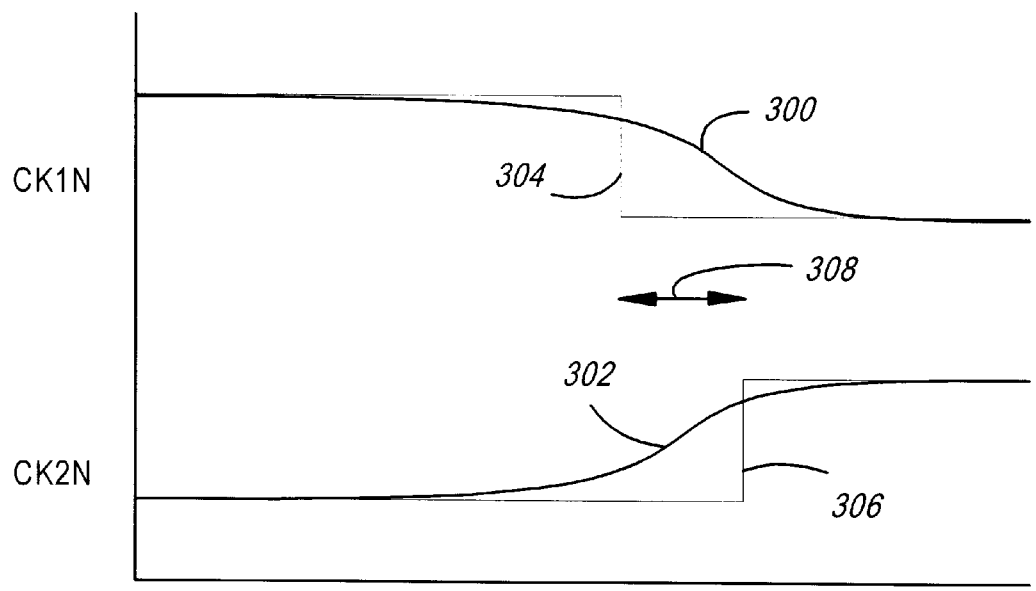
FIG. 3 is a timing diagram illustrating edge degradation.

A method of checking for races in a digital design is illustrated in FIG. 1. The method generally comprises the steps of inputting 104, 106 circuit models (digital design models) 404, FIG. 4, into a fet level simulator 400, and generating 104, 106 raw data files 406, 500, 502, FIG. 5, comprising values for all of a model's nodes. Once generated, corresponding values in the raw data files 500, 502 are compared 108 to identify nodes in a circuit (digital design) which are affected by races. Each model 404 input into the fet level simulator 400 comprises a clock gater circuit 700, FIG. 7, which is configured to produce a number of clocks 706, 708, 710, 712 having varying degrees of overlap (e.g., see FIGS. 8, 9 or 10).

Figure 4:
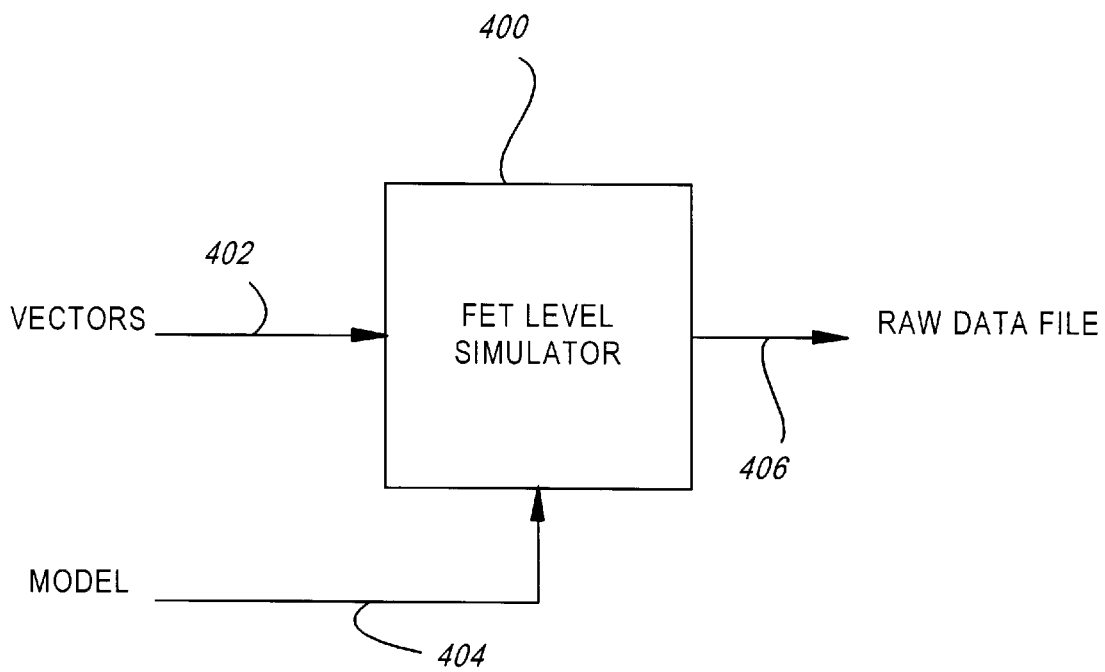
FIG. 4 is a schematic showing the inputs and outputs of a fet level simulator which may be used in the method of FIG. 1.
Figure 5:
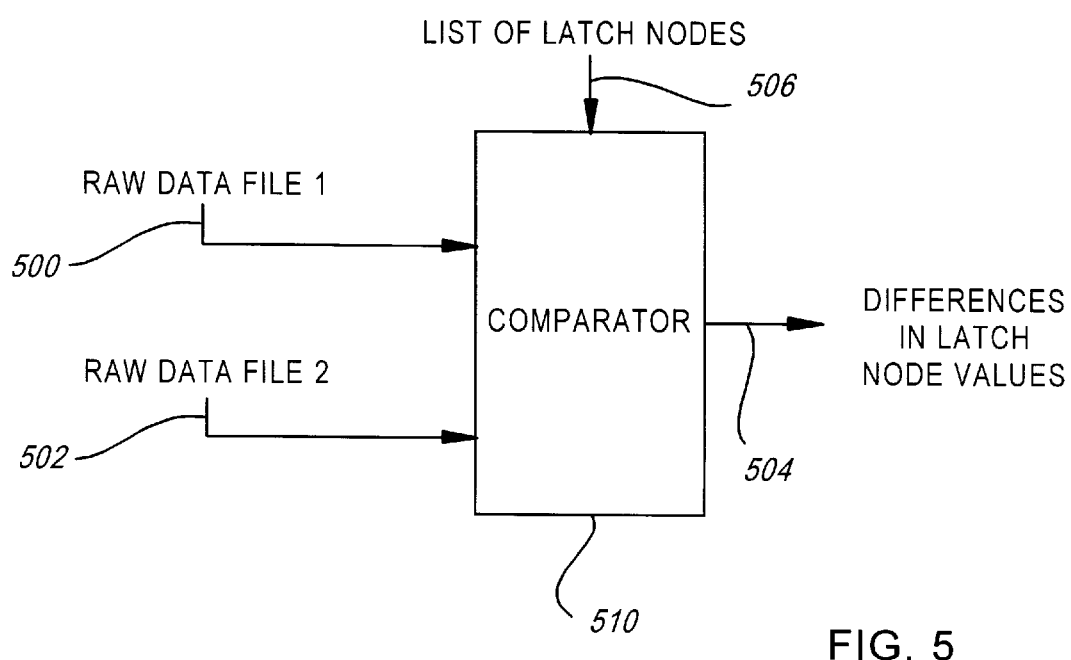
FIG. 5 is a schematic showing a data file comparator which may be used in the method of FIG. 1.

In a similar fashion, apparatus for identifying races in a digital design (circuit) generally comprises means for constructing a plurality of digital design models (circuit models), means 400, FIG. 4, for generating first 500 and second 502 raw data files (FIG. 5) corresponding to first and second of the plurality of models 404 and means 510 for comparing corresponding latch node values 506 generated for the first and second models. Each raw data file 500, 502 generated 104, 106, FIG. 1, preferably comprises a list of node values generated during simulated operation (FIG. 4) of a model 404.

Having thus described a method and apparatus of checking for races in a digital design in general, the method and apparatus will now be described in further detail.

Figure 6:
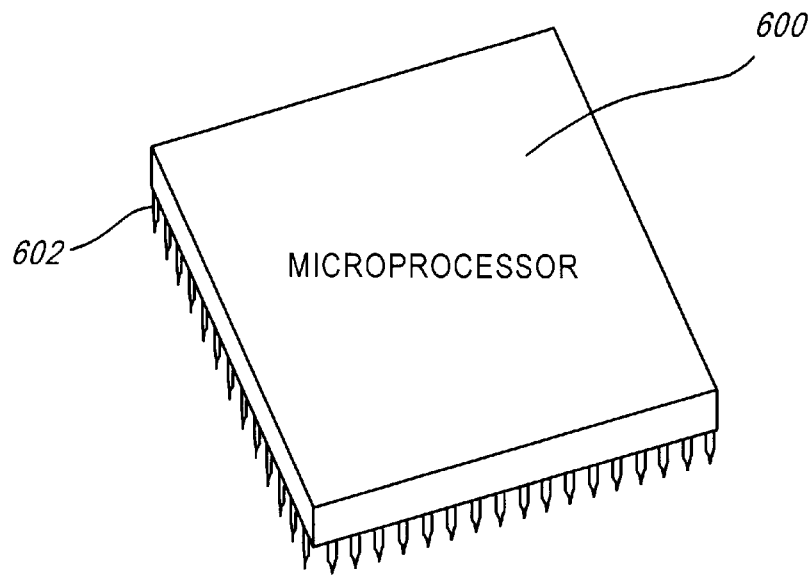
FIG. 6 is a perspective view of a microprocessor.

In its preferred embodiment, the method begins with the construction of a plurality of circuit models 100, 102 (or, as referred to in the claims, "digital design models"). See FIG. 1. In a VLSI circuit 600 comprising only one system clock, 602, FIG. 6, with additional clock signals being generated from the system clock 602 using clock gater(s) or similar buffer circuit(s) (collectively referred to herein as "a clock gater circuit"), the models preferably comprise at least one model with a race inducing clock gater circuit.

As used in this description, a normal clock gater circuit is understood to generate simulated "real time" clock signals for a circuit, and a model with a normal clock gater circuit is understood to generate nothing but simulated "real time" clock signals. A race inducing clock gater circuit is defined as a circuit generating clock signals which are delayed or advanced with respect to their simulated "real time" equivalents. A model with a race inducing clock gater circuit is defined as a model which generates one or more delayed and/or advanced clock signals. The clock signals produced by a model with a race inducing clock gater circuit will therefore have overlaps and dead times which differ from those produced by a model with a normal clock gater circuit.

The differing clock overlaps and/or dead times produced by the models with race inducing clock gater circuits are used to excite races which might not occur in a computer simulated "real time" operation wherein clock skews and degraded clock edges caused by line loading and/or fabrication irregularities do not exist. Note that clock delays are used to simulate clock skew and edge degradation. Therefore, a delay of a signal with respect to another signal is used to excite the same races which would be excited by the skew or degradation of one or both of the signals.

The details of circuit modeling should be familiar to one skilled in the art, and a discussion of same is beyond the scope of this description. All circuit models created for use with this method are stored in computerized form (such as a netlist or the like).

After circuit models (at a minimum, a first and second model) have been constructed 100, 102, the models are successively input 104, 106 into a fet level simulator 400. See FIG. 4. The models are input with varying vector inputs 402. Varied vector inputs 402 are preferred since this increases the number of operating conditions/situations under which a circuit is tested for races, thus increasing race coverage.

A raw data file 406 will be produced for each combination of model 404 and vector 402 inputs. Unlike the output of a simulator 400 after top level signal assertion, a raw data file 406 comprises a list of values for all nodes within a circuit model 404. Preferably, a raw data file 406 also comprises time stamps corresponding to each of the listed node values.

A minimum of two models need to be input into the simulator, thereby generating first 500 and second 502 raw data files for first and second models. However, more models may be input into the simulator 400. In a following example, two models with race inducing clock gater circuits (producing the clock timing diagrams of FIGS. 9 and 10), and one model with a normal clock gater circuit (producing the clock timing diagram of FIG. 8), are input into the fet level simulator 400.

After generating at least two raw data files 406, races are observed by comparing 108 corresponding latch node values 506 in the raw data files 500, 502 (using a software comparator 510 running on a programmable computer, or similar means). See FIG. 5. If a circuit is not susceptible to races, the values obtained for a particular latch node should be identical in each of the raw data files 500, 502 obtained from the simulator 400. If a comparison 108 of values shows that the latch node values obtained for two different models differ 504, a race has been identified, and it will need to be debugged. Note that the monitoring of latch node values, rather than top level signals, allows for a more precise pinpointing of races. By generating raw data files 406 that include values for all nodes, debugging a race becomes a more straightforward task. However, if computer storage space is limited, one may choose to generate raw data files 406 which comprise only lists of latch node values. Additional node values can then be generated as needed.

Note that comparisons may be made between raw data files 500, 502 corresponding to 1) a model with a normal clock gater circuit and a model with a race inducing clock gater circuit, or 2) two models with race inducing clock gater circuits (i.e., two skew models).

If raw data files 406 are generated using varied model and vector inputs, raw data file comparisons 108 are made between raw data files 500, 502 generated for differing models having similar vector inputs.

Figure 11:
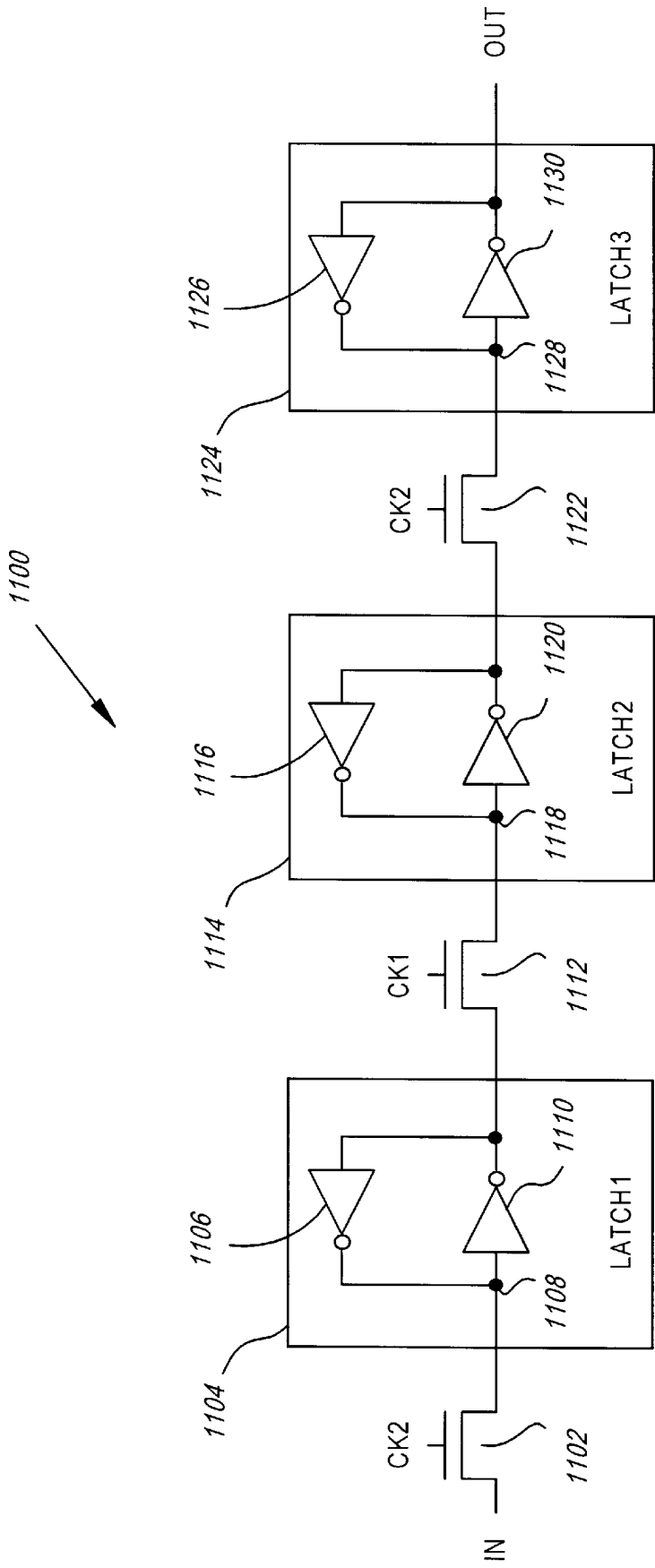
FIG. 11 is a schematic of a pipeline circuit which, in conjunction with FIGS. 8–10, may be used to illustrate a race condition.

FIG. 11 illustrates a simple register pipeline 1100 in which a race is likely to occur. The register pipeline 1100 comprises three latches 1104, 1114, 1124 comprising cross-coupled inverters 1106/1110, 1116/1120, 1126/1130. Data flow into each latch 1104, 1114, 1124 is gated by a transfer fet 1102, 1112, 1122. LATCH1 1104 is gated by a transfer fet 1102 responding to clock signal CK2; LATCH2 1114 is gated by a transfer fet 1112 responding to clock signal CK1; and LATCH3 1124 is gated by a transfer fet 1122 responding to clock signal CK2. The flow of data is from IN to OUT. If signal CK2 goes HI before signal CK1 goes LO, data will flow into LATCH2 1114 before data already stored in that register 1114 can be passed to the next stage 1124 of the pipeline 1100. By monitoring the values of each latch node 1108, 1118, 1128 under varying overlaps and dead times of clock signals CK2 and CK1, race locations can be precisely pinpointed. For example, if the method of checking for races described above generated inconsistent values for latch node 1118, one could immediately assume that a race was occurring between clock signals CK2 and CK1 (i.e., clock CK2 rose before clock CK1 fell, and consequently, new data was gated through transfer fet 1112 before data existing at node 1118 was gated through transfer fet 1122 to node 1128). One can see that monitoring the values of latch nodes is a more precise method of pinpointing races than asserting top level signals. Debug time under the new method is reduced to a minimum.

Additional understanding of the advantages and uses of the above described method and apparatus may be derived from the following example. Consider the microprocessor 600 (a species of VLSI circuit) of FIG. 6. For purposes of the example, it will be assumed that the microprocessor 600 is designed with a single system clock input 602 (CK) from which overlapping and non-overlapping clock signals are generated using a clock gater circuit 700 which is internal to the microprocessor chip. Already, it can be appreciated that race checking through a variation of system clock timing will not work. A variation in the timing of the single system clock input 602 results in a proportional variation in each of the microprocessor's internally generated clocks 706, 708, 710, 712, and as a result, signal overlap and dead time remains constant and clock races cannot be induced.

Figure 7:
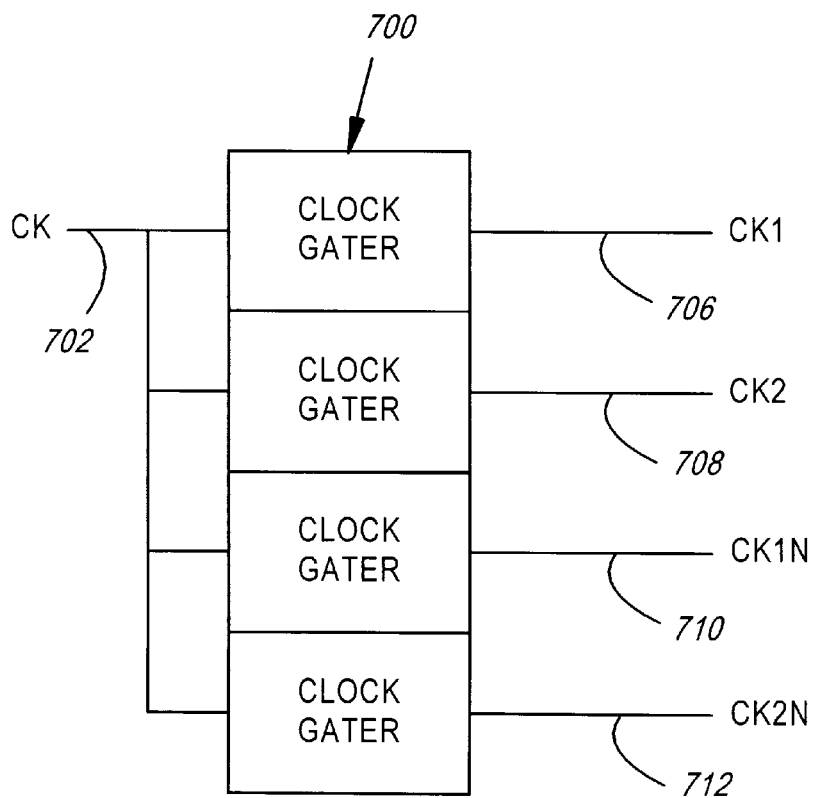
FIG. 7 is a schematic of a clock gater circuit which uses one or more clock gaters to produce two overlapping clock signals, CK1 and CK2, and two non-overlapping clock signals, CK1N and CK2N from a single system clock, CK.
Figure 8:
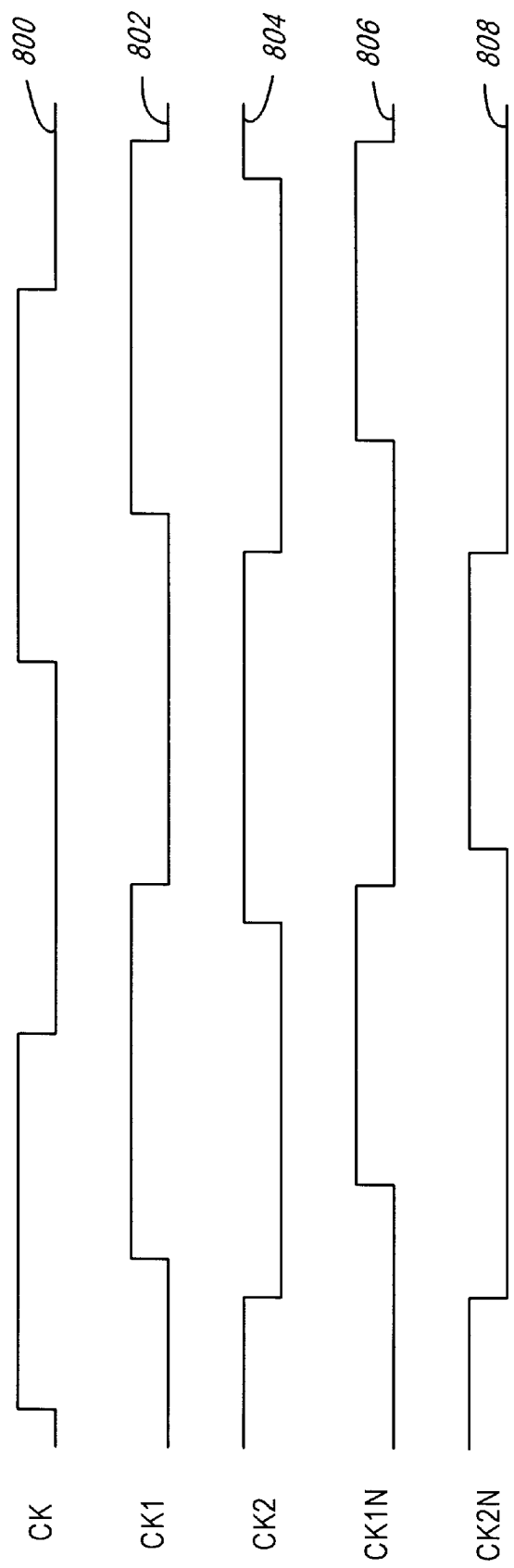
FIG. 8 is a timing diagram illustrating the timing relationships between clock signals generated by a "modeled" normal clock gater circuit.

A model of the microprocessor 600 will include a model of the microprocessor's clock gater circuit 700, as shown in FIG. 7. The gater circuit produces overlapping clock signals CK1 706 and CK2 708, and non-overlapping clock signals CK1N 710 and CK2N 712 (N standing for non-overlapping). Exemplary timings 802, 804, 806, 808 of the overlapping (CK1 706 and CK2 708) and non-overlapping (CK1N 710 and CK2N 712) signals of FIG. 7 are shown graphically in FIG. 8, along with the timing 800 of the system clock 702. A model including the clock gater circuit 700 of FIG. 7, and producing the clock signals 802, 804, 806, 808 of FIG. 8, will be used as a model with normal clock gaters.

Models comprising a race inducing clock gater circuit may be derived relatively quickly through a remodeling of the microprocessor's clock gater circuit 700. For example, the circuitry used to generate signals CK1 706 and CK1N 710 could be altered, while the circuitry used to generate signals CK2 708 and CK2N 712 is left unchanged, so that clock signals 706, 708, 710, 712 having the timings 902, 904, 906, 908 shown in FIG. 9 are produced. For reference, the timing 900 of the system clock 702 is also shown in FIG. 9. Note that the timings 902, 906 of signals CK1 706 and CK1N 710 are delayed with respect to their simulated "real time" equivalents 802, 806, but that the timings 904, 908 of signals CK2 708 and CK2N 712 remain unchanged. The delay in CK1 706 creates an additional overlap 910 between the falling edges 912 of CK1 902 and the rising edges 914 of CK2 904, and an additional dead time 922 between the rising edges 924 of CK1 902 and the falling edges 926 of CK2 904. Although race inducing increases in signal overlap 910 and/or dead time 922 are process specific, it has been determined that an induced increase in overlap 910 and dead time 922 of two gate delays (for total overlaps and total dead times of three gate delays) is advantageous in checking for races in the Hewlett-Packard PA-8000 microprocessor, as will be more specifically explained later in this description. Likewise, a two gate delay of signal CK1N 710 creates an overlap 916 of one gate delay between the falling edges 918 of CK1N 906 and the rising edges 920 of CK2N 908, and a dead time 928 of five gate delays between the rising edges 930 of CK1N 906 and the falling edges 932 of CK2N 908.

A second model with a race inducing clock gater circuit could be produced by altering the circuitry which generates signals CK2 708 and CK2N 712, while leaving the circuitry which generates signals CK1 706 and CK1N 710 unchanged. The timings 1002, 1004, 1006, 1008 of signals 706, 708, 710, 712 produced by the clock gater circuit 700 of such a model might appear as in FIG. 10. For the purpose of comparison, the timing 1000 of the system clock 702 is also shown in FIG. 10. The timings 1004, 1008 of signals CK2 708 and CK2N 712 are now delayed with respect to their simulated "real time" equivalents 804, 808. By delaying these signals 708, 712 by four gate delays, a three gate overlap 1010 between the rising edges 1012 of CK1 1002 and the falling edges 1014 of CK2 1004, a three gate dead time 1022 between the falling edges 1024 of CK1 1002 and the rising edges 1026 of CK2 1004, a one gate overlap 1016 between the rising edges 1018 of CKLN 1006 and the falling edges 1020 of CK2N 1008, and a five gate dead time 1028 between the falling edges 1030 of CKIN 1006 and the rising edges 1032 of CK2N 1008, are produced.

Note that the creation of two models with race inducing clock gater circuits allows clock signal overlap to be increased and/or decreased between both rising/falling and falling/rising edge pairs of all clocks 706, 708, 710, 712. By providing varying degrees of overlap 910, 916, 1010, 1016 and dead time 922, 928, 1022, 1028 between the clock signals 706, 708, 710, 712, the exemplary models allow races to be identified between signals CK1 706 and CK2 708, CK1 706 and CK2N 712, CK2 708 and CK1N 710, and CK1LN 710 and CK2N 712. Varying signal overlap and dead time also assists in identifying clock races between the system clock, CK 702, and any of the gated clock signals (CK1 706, CK2 708, CK1N 710 or CK2N 712). The induced overlaps and dead times between clock signals simulate clock skew and edge degradation 204 which might be expected to occur under certain operating scenarios ranging from "normal" to "worst case".

When creating models with race inducing clock gater circuits, clock delays should correspond to fet level gate delays in the circuit being modeled. The inventors HP: #10951071-1 have found that the use of race inducing models yielding signal overlaps between the non-overlapping clocks (CK1N 710 and CK2N 712) of one gate delay or less results in back to back half-latches clocked by the non-overlapping clocks of the HP PA-8000 microprocessor just passing a race test. Use of signal overlaps between the overlapping clocks (CK1 712 and CK2 714) of three gate delays or less results in back to back full latches clocked by the overlapping clocks of the HP PA-8000 microprocessor barely failing the race test.

By observing and comparing the values of every latch node, race coverage is significantly increased over previous methods wherein only those failures propagating to a top level I/O port are observed. Furthermore, the monitoring of all nodes makes a race easier to debug due to the pinpointing of a race's earliest presence. Races are not checked on a pass/fail basis, and there is no need to "trace" a race to its root cause as is done after an assertion of top level signals.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method of identifying nodes affected by races in a digital design, the method comprising the steps of:
    a) inputting models of the digital design into a fet level simulator, each model comprising a clock gater circuit producing clocks with differing overlaps and dead times;
    b) generating raw data files corresponding to each model input;
    c) comparing values in the raw data files to identify nodes affected by races.

2. A method as in claim 1, further comprising the steps of:
    a) varying vector inputs to the fet level simulator as each model of the digital design is input into the fet level simulator; and
    b) generating raw data files corresponding to each combination of model and vector inputs, wherein the step of comparing values in the raw data files comprises comparing values in raw data files generated for differing models with common vector inputs.

3. A method as in claim 1, wherein the models of the digital design comprise at least one model with a race inducing clock gater circuit.

4. A method as in claim 3, wherein the digital design comprises only one system clock.

5. A method as in claim 3, wherein the raw data files comprise lists of node values.

6. A method as in claim 5, wherein the raw data files further comprise time stamps corresponding to the node values.

7. A method as in claim 3, wherein the models of the digital design further comprise a model with a normal clock gater circuit, and the model with the normal clock gater circuit produces two overlapping clock signals, and two non-overlapping clock signals.

8. A method as in claim 1, further comprising the step of constructing a plurality of models of the digital design, the models comprising at least one model with a race inducing clock gater circuit.

9. A method as in claim 8, wherein the steps of inputting models of the digital design into a fet level simulator, and generating raw data files, comprise:
    a) inputting a first of the constructed models into a fet level simulator and generating a first raw data file for the digital design; and
    b) inputting a second of the constructed models into the fet level simulator and generating a second raw data file for the digital design.

10. A method as in claim 9, wherein each of the first and second raw data files comprises a list of node values with corresponding time stamps.

11. A method as in claim 9, wherein the step of comparing values in the raw data files to identify nodes affected by races comprises comparing corresponding latch node values in the first and second raw data files.

12. A method as in claim 11, wherein the digital design comprises only one system clock.

13. A method as in claim 9, wherein the first and second of the constructed models are chosen from a group of models comprising:
   a) a model with a normal clock gater circuit; and
   b) at least one model with a race inducing clock gater circuit.

14. A method as in claim 13, wherein the model with a normal clock gater circuit produces two overlapping clock signals, CK1 and CK2, and two non-overlapping clock signals, CK1N and CK2N.

15. A method as in claim 14, wherein the at least one model with a race inducing clock gater circuit comprises:
   a) a first model with a race inducing clock gater circuit, the model producing:
      i) delayed CK1 and CK1N clock signals; and
      ii) normal CK2 and CK2N clock signals; and
   a second model with a race inducing clock gater circuit, the model producing:
      i) normal CK1 and CK1N clock signals; and
      ii) delayed CK2 and CK2N clock signals.

16. A method as in claim 15, wherein:
   a) in the first model with a race inducing clock gater circuit,
      i) an approximate three gate delay overlap exists between falling edges of the CK1 clock signal and rising edges of the CK2 clock signal; and
      ii) an approximate one gate delay overlap exists between falling edges of the CK1N clock signal and rising edges of the CK2N clock signal; and
   b) in the second model with a race inducing clock gater circuit,
      i) an approximate three gate delay overlap exists between rising edges of the CK1 clock signal and falling edges of the CK2 clock signal; and
      ii) an approximate one gate delay overlap exists between rising edges of the CK1N clock signal and falling edges of the CK2N clock signal.

17. Apparatus for identifying races in a digital design, the apparatus comprising:
   a) means for constructing a plurality of models of the digital design;
   b) means for generating first and second raw data files corresponding to first and second of the plurality of models, each raw data file comprising a list of node values generated during simulated operation of a model; and
   c) means for comparing corresponding latch node values generated for the first and second models to identifying races in the digital design.

18. Apparatus as in claim 17, wherein the means for generating raw data files is a fet level simulator.

19. Apparatus as in claim 17, wherein the means for comparing corresponding latch node values is a programmed computer.

* * * * *

UNITED STATES PATENT AND TRADEMARK OFFICE
CERTIFICATE OF CORRECTION

PATENT NO. : 5,901,061
DATED : May 4, 1999
INVENTOR(S) : Neela Bhakta Gaddis et al.

It is certified that error appears in the above-identified patent and that said Letters Patent is hereby corrected as shown below:

Column 9,
Line 18, delete "a second" and insert therefor -- b) a second --

Signed and Sealed this

Fourth Day of June, 2002

Attest:

Attesting Officer

JAMES E. ROGAN
Director of the United States Patent and Trademark Office